United States Patent
Cheng

(10) Patent No.: US 7,974,065 B2
(45) Date of Patent: Jul. 5, 2011

(54) ELECTRIC ARC ISOLATION STRUCTURE FOR TRANSFORMERS

(75) Inventor: Ying-Chang Cheng, Taipei Hsien (TW)

(73) Assignee: Zippy Technology Corp., Hsin-Tien, Taipei Hsien (TW)

( * ) Notice: Subject to any disclaimer, the term of this patent is extended or adjusted under 35 U.S.C. 154(b) by 284 days.

(21) Appl. No.: 11/979,016

(22) Filed: Oct. 30, 2007

(65) Prior Publication Data

US 2009/0107698 A1 Apr. 30, 2009

(51) Int. Cl.
*H05F 3/00* (2006.01)
(52) U.S. Cl. ........................................ 361/220
(58) Field of Classification Search ............ 361/220
See application file for complete search history.

(56) References Cited

U.S. PATENT DOCUMENTS

| | | | | |
|---|---|---|---|---|
| 5,038,426 A | * | 8/1991 | Boretski | 5/93.1 |
| 5,998,909 A | * | 12/1999 | Kumasaka et al. | 310/348 |
| 6,095,175 A | * | 8/2000 | Miller et al. | 137/15.18 |
| 6,344,706 B1 | * | 2/2002 | Morita et al. | 310/340 |
| 6,507,139 B1 | * | 1/2003 | Ishino et al. | 310/348 |
| 6,867,955 B2 | * | 3/2005 | Chou et al. | 361/42 |
| 7,095,162 B2 | | 8/2006 | Chou et al. | |
| 7,235,916 B2 | | 6/2007 | Chou et al. | |
| 2002/0126980 A1 | * | 9/2002 | Holman et al. | 385/135 |
| 2004/0140898 A1 | * | 7/2004 | Reeves | 340/573.1 |
| 2008/0224570 A1 | * | 9/2008 | Florian et al. | 310/341 |
| 2008/0315981 A1 | * | 12/2008 | Yang et al. | 336/65 |

* cited by examiner

*Primary Examiner* — Jared J Fureman
*Assistant Examiner* — Ann T Hoang
(74) *Attorney, Agent, or Firm* — Muncy, Geissler, Olds & Lowe, PLLC

(57) ABSTRACT

The present invention discloses an electric arc isolation structure for isolating an electric arc produced by an arc discharge at a transformer, and the transformer includes a primary side input electrode terminal and a secondary side high-voltage output terminal. The exterior of the transformer is covered by an insulating sheath, and the insulating sheath at least fully covers the secondary side high-voltage output terminal of the transformer.

5 Claims, 6 Drawing Sheets

ELECTRIC ARC ISOLATION STRUCTURE FOR TRANSFORMERS

FIELD OF THE INVENTION

The present invention relates to an electric arc isolation structure for transformers, and more particularly to the electric arc isolation structure applied at a secondary side high-voltage output terminal of a transformer for isolating an electric arc.

BACKGROUND OF THE INVENTION

Electronic instruments of an aircraft at high altitudes require special measures to prevent an "arc discharge" that is occurred at high attitudes easily, since the air at high altitudes is less dense and the conducting impedance of air at high altitudes is lower than that on the ground.

The so-called "Arc Discharge" refers to an electric spark in an arc shape that occurs between two electrodes when a high-voltage power is applied between the two electrodes, and the two electrodes are drawn closer with each other to a specific distance. Electric arc (also known as corona) is similar to lightning caused by thundercloud, except that lightning fleets, and an electric arc between two electrodes lasts long to form heat accumulation. In the field of electronic circuits, arc discharge often ruins the functions of electronic components and damages electronic circuits. More seriously, arc discharge may even cause fire and jeopardize our life and safety.

In electronic instruments of an aircraft, the secondary side high-voltage output terminal of a high-voltage transformer forms an electric arc caused by an arc discharge very easily. Since a traditional transformer 1 usually has to go through an insulation process that adopts an insulating varnish 11 in a dipping process (as shown in FIG. 1A), and the temperature difference between high altitude and ground causes a brittle peeling due to the thermal expansion and contraction effect on the cured insulating varnish 11 as shown in FIG. 1B, so that a crevice 13 produced by the brittle peeling of the insulating varnish 11 is formed between an electric contact at a high-voltage terminal of the transformer 1 and the primary side input electrode terminal of the transformer 1, or an electric arc is formed by an adjacent electronic instrument. In U.S. Pat. Nos. 7,095,162 and 7,235,916, the inventor of the present invention disclosed a piezoelectric blade anchoring structure, wherein the piezoelectric blade is mounted onto a circuit board, and the piezoelectric blade has an electric contact thereon, and a conductive member is electrically connected between the electric contact and the circuit board, such that the conductive member is attached with the electric contact by a protecting plate at normal condition to prevent a gap or a loosening condition occurred between the piezoelectric blade and the conductive member due to vibrations and prevent oxidation to assure a good electrical connection effect of the piezoelectric blade and circuit board and prevent damages. However, the adhesiveness of the protecting plate applied to aircrafts at high altitude may lose its efficacy due to the thermal expansion and contraction effects, and the electric arc effect is conducted non-directionally from a low-voltage point of a device proximate to the high-voltage output terminal, so that the conductive member is only protected by the protecting plate, but it is not completely isolated. As a result, the risk and concern still exist.

SUMMARY OF THE INVENTION

The primary objective of the present invention is to isolate an electric arc caused by an arc discharge at a secondary side high-voltage output terminal of a transformer.

To achieve the foregoing objective, the present invention provides an electric arc isolation structure for transformers, and the structure is applied for isolating a transformer due to an electric arc produced by an arc discharge, and the transformer has a primary side input electrode terminal and a secondary side high-voltage output terminal, characterized in that the exterior of the transformer is covered by an insulating sheath, and the insulating sheath at least fully covers a secondary side high-voltage output terminal of the transformer.

Another objective of the present invention is to dissipate the heat produced by the electric arc.

To achieve the foregoing objective, the present invention forms a covered space inside the insulating sheath, and the covered space is greater than the external diameter of the secondary side high-voltage output terminal, such that the heat produced by an electric arc inside the insulating sheath can be dissipated to the outside through the gaps between the insulating sheath and the secondary side high-voltage output terminal to prevent accidents caused by heat accumulation.

A further objective of the present invention is to reduce the effect of a shock or a vibration of the transformer, when the insulating sheath is touched or shaken.

To achieve the foregoing objective, the present invention installs a shock absorbent pad in the covered space between the insulating sheath and the transformer.

DETAILED DESCRIPTION OF THE PREFERRED EMBODIMENTS

The technical contents of the invention will now be described in more detail hereinafter with reference to the accompanying drawings that show various embodiments of the invention.

Figure 1A:
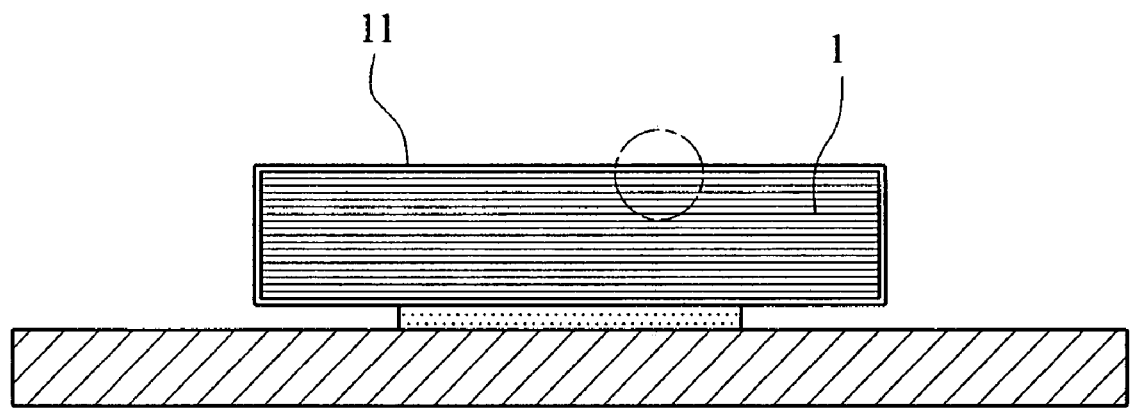
FIG. 1A is a schematic view of a structure with a brittle peeling of insulating varnish of a prior art piezoelectric blade.
Figure 1B:
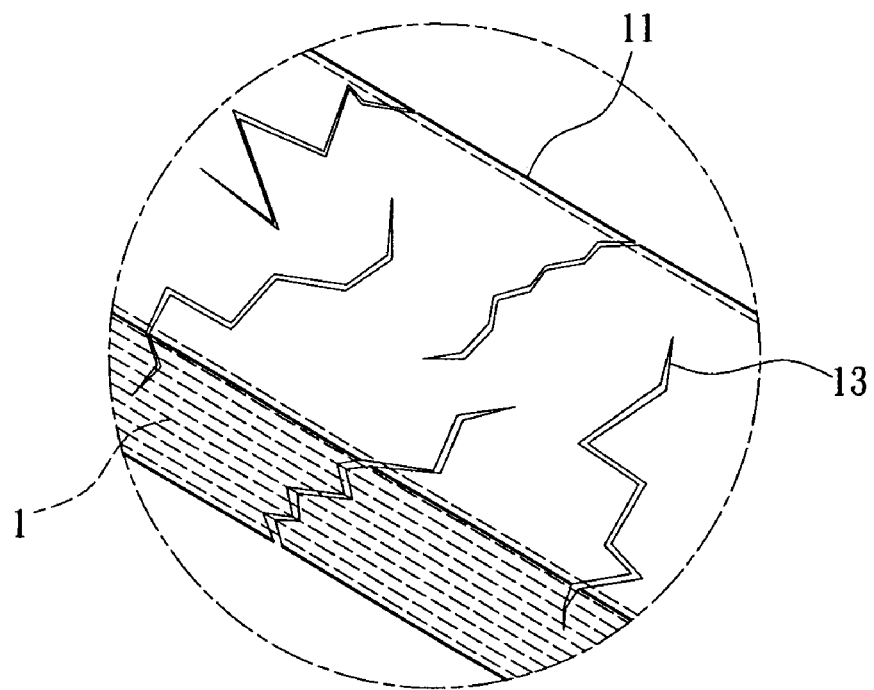
FIG. 1B is an enlarged view of a portion with a brittle peeling of insulating varnish of a prior art piezoelectric blade.
Figure 2:
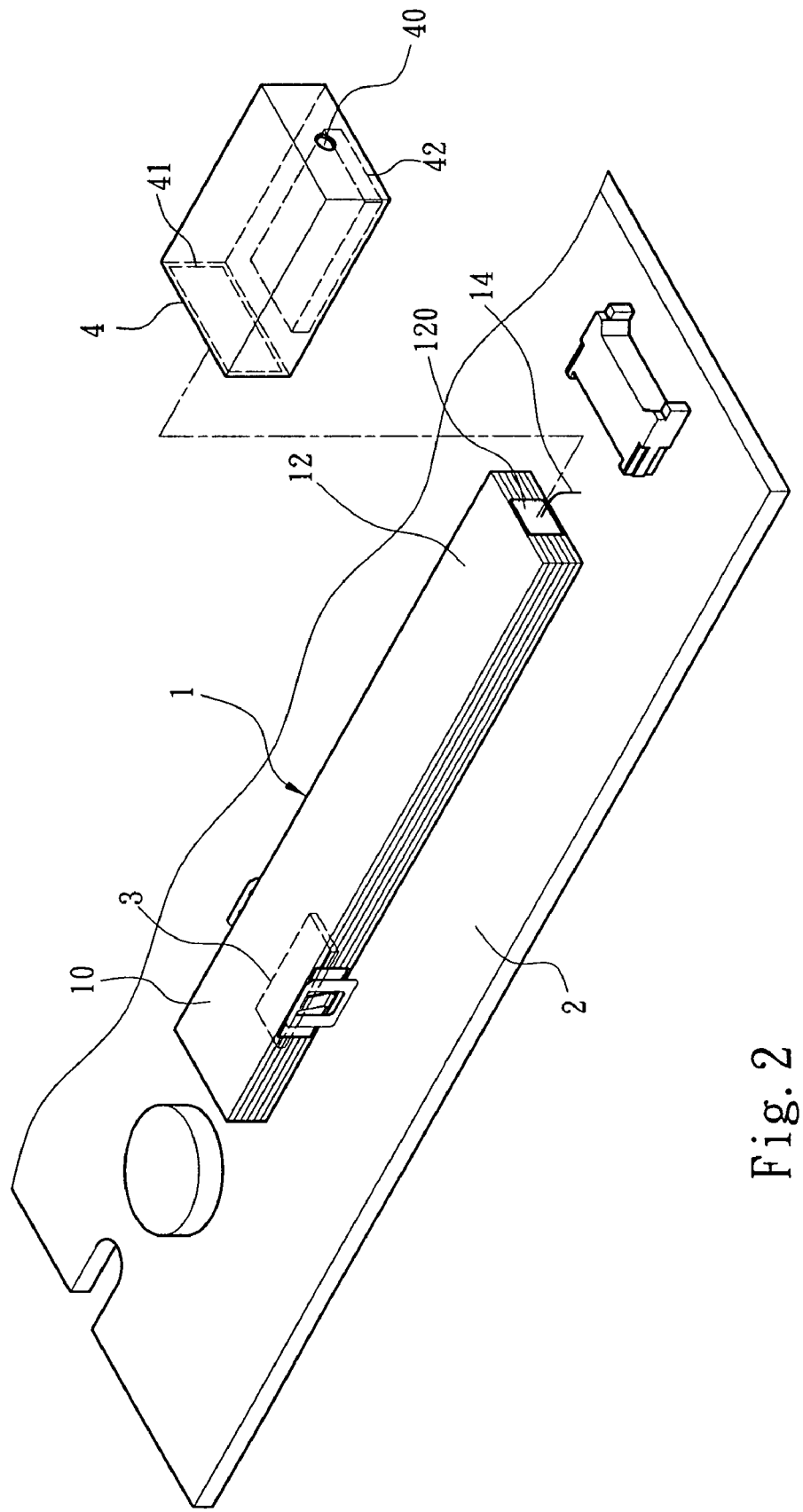
FIG. 2 is an exploded view of a structure in accordance with a preferred embodiment of the present invention.
Figure 3:
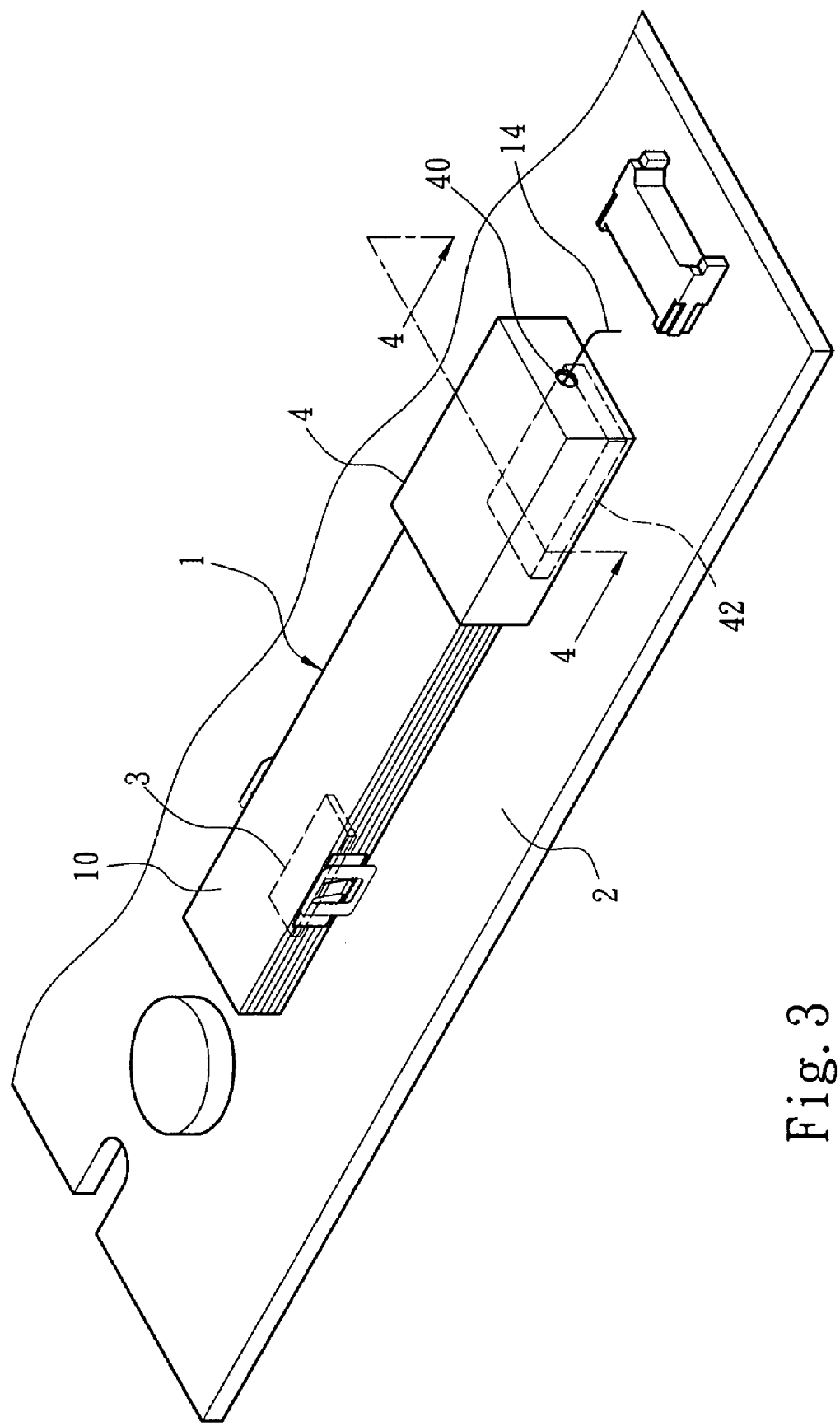
FIG. 3 is a perspective view of a structure in accordance with a first preferred embodiment of the present invention.
Figure 4:
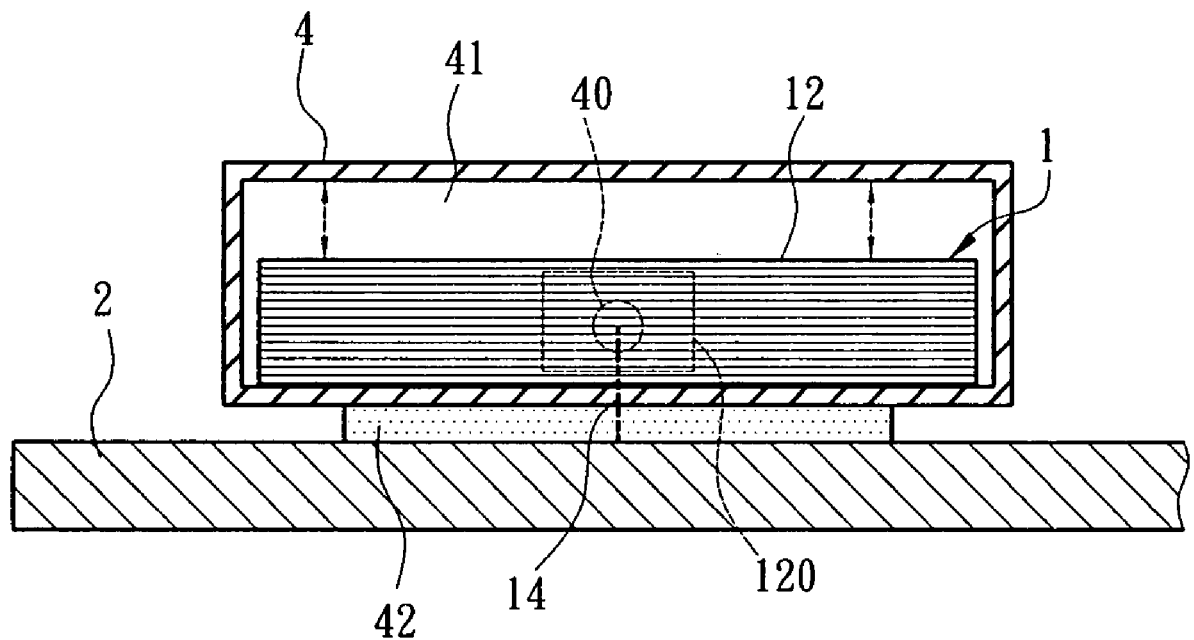
FIG. 4 is a section view of a first preferred embodiment of the present invention.

Referring to FIGS. 2 to 4 for an exploded view, a perspective view and a section view in accordance with a preferred embodiment of the present invention respectively, wherein FIG. 4 is a section view of Section A-A as depicted in FIG. 3, the present invention provides an electric arc isolation structure for transformers, and the structure is applied for isolating an electric arc produced by an arc discharge at a transformer 1, and the transformer 1 has a primary side input electrode terminal 10 and a secondary side high-voltage output terminal 12. In this embodiment, a piezoelectric transformer is used as an example for illustration purpose only, and the connecting method of a wound transformer is the same as that of the piezoelectric transformer, and thus will not be described here.

The electric arc isolation structure for transformers in accordance with the present invention is characterized in that:

The exterior of the transformer 1 is covered by an insulating sheath 4, and the insulating sheath 4 at least fully covers a secondary side high-voltage output terminal 12 of the transformer 1, wherein the insulating sheath 4 has a through hole 40 disposed at an electric contact 120 corresponding to the secondary side high-voltage output terminal 12, and the insulating sheath 4 defines a covered space 41 therein, and the covered space 41 is equal to or greater than the external diameter of the secondary side high-voltage output terminal 12. In this embodiment, the covered space 41 is greater than the external diameter of the secondary side high-voltage output terminal 12.

The piezoelectric transformer can be a single-layer or a multiple-layer transformer 1 installed onto a circuit board 2, and the transformer 1 installs an elastic body 3 in an appropriate vibrating space between the transformer 1 and the circuit board 2, and a conductive member 14 is installed and electrically connected between the electric contact 120 and the circuit board 2, and the conductive member 14 can be a metal wire. Since the insulating sheath 4 at least fully covers the secondary side high-voltage output terminal 12 of the transformer 1, and a connecting member 42 is used for fixing the insulating sheath 4 onto the circuit board 2 to isolate an electric arc caused by an arc discharge at the electric contact 120, therefore the invention can overcome the shortcomings of a prior art having an electric arc caused by a brittle peeling of insulating varnish or gel.

The insulating sheath 4 can be made of a good insulating material including silicone, rubber and insulating plastic, and the through hole 40 is provided for passing the conductive member 14 into the circuit board 2. The insulating plastic is mainly composed of several complex binders such as asphalt, natural resin or synthetic resin and includes no volatile solvent, and thus the insulating plastic can be used for protecting the surface of an electric appliance, and the main resin composition includes polyester, epoxy resin, polyurethane, polybutadiene, organic silicon, polyester-imide and polyamide-imide that can be used as a quick photocuring insulating plastic, such as an unsaturated polyester type and acrylic acid type photocuring insulating plastic.

It is noteworthy to point out that the covered space 41 is greater than the external diameter of the secondary side high-voltage output terminal 12 in this embodiment, so that an appropriate interval is remained between the insulating sheath 4 and the secondary side high-voltage output terminal 12. If the insulating sheath 4 is installed to a high voltage terminal of the transformer 1 and fixed to the circuit board 2, since there is an appropriate interval between the insulating sheath 4 and the secondary side high-voltage output terminal 12, the heat produced by the transformer 1 during vibration or operation will be dissipated to the outside immediately through the interval between the insulating sheath 4 and the secondary side high-voltage output terminal 12, so as to prevent overheat caused by heat accumulation and prevent damages to the transformer 1 and accidents caused by heat accumulation.

Figure 5:
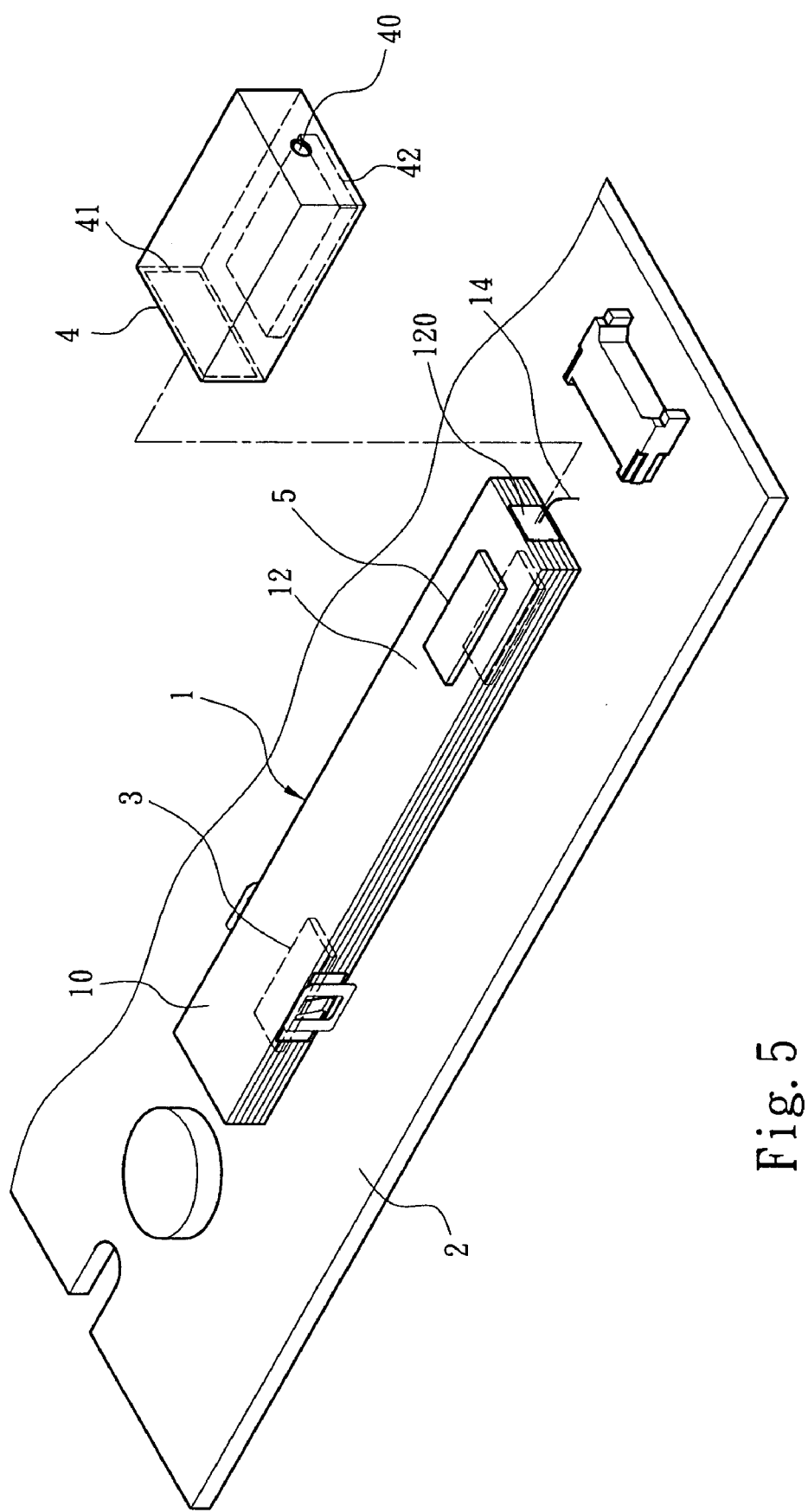
FIG. 5 is a perspective view of a structure in accordance with a second preferred embodiment of the present invention.
Figure 6:
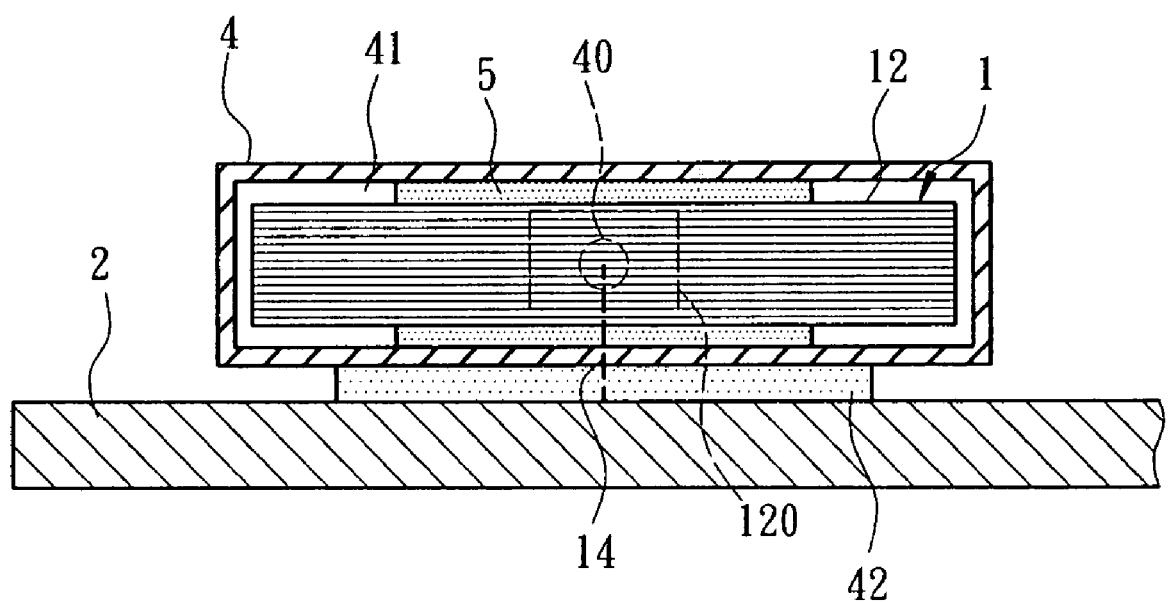
FIG. 6 is a section view of a second preferred embodiment of the present invention.

Referring to FIGS. 5 and 6 for an exploded view and a section view of a structure in accordance with a second preferred embodiment of the present invention respectively, the major difference of this embodiment with the first preferred embodiment resides on that a shock absorbent pad 5 is installed in the covered space 41 between the insulating sheath 4 and the transformer 1, such that when the transformer 1 is vibrated or operated, the effect of touching the insulating sheath 4 due to the vibration and operation of the transformer 1 can be reduced.

In summation of the description above, the present invention adopts the insulating sheath 4 to at least fully cover the secondary side high-voltage output terminal 12 of the transformer 1 and isolate an electric arc caused by an arc discharge at the electric contact 120, so as to overcome the shortcoming of the prior art having an electric arc due to the brittle peeling of insulating varnish or glue. In addition, the covered space 41 is greater than the external diameter of the secondary side high-voltage output terminal 12, and thus the heat produced during the vibration and operation of the transformer 1 will be dissipated to the outside immediately through the interval between the insulating sheath 4 and the secondary side high-voltage output terminal 12 to prevent overheat caused by heat accumulation. The invention not only avoids damages of the transformer 1, but also prevents accidents caused by heat accumulation. With the shock absorbent pad 5 installed on a surface between the insulating sheath 4 and the secondary side high-voltage output terminal 12 of transformer 1, the effect of touching the insulating sheath 4 during the vibration and operation of the transformer 1 can be reduced. The present invention not only isolates the electric arc and avoids damages of the transformer 1, but also prevents accidents caused by heat accumulation, and reduces the effect of touching the insulating sheath 4 during the vibration and operation of the transformer 1.

While the invention has been described by means of specific embodiments, numerous modifications and variations could be made thereto by those skilled in the art without departing from the scope and spirit of the invention set forth in the claims.

In summation of the description above, the present invention improves the aforementioned effects of the prior art, and complies with the requirements of patent application, and thus is duly filed for patent application.

What is claimed is:

1. An electric arc isolation structure for transformers, for isolating an electric arc produced in an arc discharge at a transformer, and the transformer including a primary side input electrode terminal and a secondary side high-voltage output terminal, characterized in that:

the exterior of the transformer is covered by an insulating sheath, and the insulating sheath covers the secondary side high-voltage output terminal of the transformer;

wherein the insulating sheath has a top, bottom, two sides and one end, with another end being open to receive the secondary side of the transformer and defines a covered space therein, and the covered space is greater than the external diameter of the secondary side high-voltage output terminal so that the sheath covers a top, bottom, two sides and an end of the secondary side of the transformer;

wherein the sheath includes a portion between the secondary side high-voltage output terminal and a circuit board on which the transformer is mounted;

further comprising a shock absorbent pad to absorb vibration of the transformer installed between the insulating sheath and the transformer.

2. The electric arc isolation structure for transformers according to claim 1, wherein the insulating sheath has a through hole disposed at an electric contact corresponding to the secondary side high-voltage output terminal.

3. The electric arc isolation structure for transformers according to claim 1, wherein the transformer is a piezoelectric transformer.

4. The electric arc isolation structure for transformers according to claim 1, wherein the transformer is a wound transformer.

5. The electric arc isolation structure for transformers according to claim 1, wherein the primary side input terminal is not covered by the sheath.

* * * * *